United States Patent [19]

Extance et al.

[11] Patent Number: 4,665,363
[45] Date of Patent: May 12, 1987

[54] OPTICAL FIBRE MAGNETIC GRADIENT DETECTOR

[75] Inventors: Philip Extance, Shirley; Roger E. Jones, Little Shelford, both of United Kingdom

[73] Assignee: STC plc, London, England

[21] Appl. No.: 831,264

[22] Filed: Feb. 20, 1986

[30] Foreign Application Priority Data

Feb. 23, 1985 [GB] United Kingdom ............... 8504730

[51] Int. Cl.$^4$ ............... G01R 33/022; G01R 33/032; G02F 1/09; G01B 9/02
[52] U.S. Cl. ..................................... 324/244; 350/376
[58] Field of Search ............... 324/96, 244, 247, 260, 324/345; 250/227; 350/375, 376

[56] References Cited

U.S. PATENT DOCUMENTS 4,587,487 5/1986 Zanzucchi ........................... 324/244
4,591,786 5/1986 Koo et al. ........................ 324/260 X

OTHER PUBLICATIONS

K. P. Koo, A. Dandridge, A. B. Tveten, and G. H. Sigel, Jr., "A Fiber-Optic DC Magnetometer", *IEEE Journal of Lightwave Technology*, vol. LT-1, No. 3, Sep. 1983, pp. 524–525.
K. P. Koo and G. H. Sigel, Jr., "A Fiber-Optic Magnetic Gradiometer", *IEEE Journal of Lightwave Technology*, vol. LT-1, No. 3, Sep. 1983, pp. 509–513.

Primary Examiner—Gerard R. Strecker
Attorney, Agent, or Firm—Kerkam, Stowell, Kondracki & Clarke

[57] ABSTRACT

Two portions (B,C) of one arm of an optical fibre Mach-Zehnder interferometer are magnetically sensitized and each has applied thereto an a.c. bias fields at a respective different frequency ($w_1$, $w_2$). One portion (A) of the other arm of the interferometer is magnetically sensitized and has two a.c. bias fields applied thereto, each at one of the different frequencies ($w_1, w_2$). The fields for portion A and C are aligned with a first direction (x) whereas those for A and B are parallel, A and B being separated in a second direction (y). The detected output of the interferometer at frequency $w_1$ is related to the magnetic gradient in the y direction, whereas the detected output at frequency $w_2$ is related to the magnetic gradient in the x direction. Thus using two bias frequencies allows one interferometer to be used to detect two gradients (FIG. 8).

11 Claims, 10 Drawing Figures

OPTICAL FIBRE MAGNETIC GRADIENT DETECTOR

BACKGROUND OF THE INVENTION

This invention relates to magnetic gradient detection and in particular to an optical fibre magnetic gradient detector.

Magnetic anomaly detection (MAD) systems are used for submarine detection and geophysical survey systems. A convenient way of detecting an anomaly is to measure the gradient of the magnetic field. The Earth's field will be distorted by an anomaly so that a gradient of the ambient field results. Our co-pending G.B. applications No. 8504729 (corresponding to Extance and Jones U.S. application Ser. No. 826,883, filed Feb. 6, 1986) and No. 8504731 (corresponding to Extance and Jones U.S. application Ser. No. 827,452, filed Feb. 10, 1986) describe various gradient detector schemes whereas the present application relates to a particular form of fibre optic magnetic gradient detector.

It is well known that when certain materials are placed in a magnetic field their length changes. Such materials are said to be magnetostrictive. For small fields of magnitude H, the change in length is proportional to $H^2$. If an optical fibre is bonded to or coated with a magnetostrictive material, or coiled around a magnetostrictive former, then the application of a magnetic field causes a change in the optical path length within the fibre, this being due to a combination of both length and refractive index changes. This path length change can be measured by incorporating the magnetically sensitised fibre in one arm of an all-fibre Mach-Zehnder interferometer and hence the magnetic field can be determined. The interferometric configuration means that small changes in fibre length may be readily detected. It is well documented that optical path length changes as small as $10^{-6}$ of a wavelength, i.e. $10^{-12}$ m may be detected. Minimum detectable fields of 1 gamma per meter of sensitised fibre have been demonstrated. Because such small length changes may be easily caused by effects other than the desired magnetostrictive one, such as temperature and pressure, the interferometer suffers from cross-sensitivity to other parameters. Since the frequency range of interest for a particular magnetic sensor is in the region 0.01 to 1 Hz, clearly the low frequency noise due to environmental fluctuations will obscure small signals. Various other parameters of the interferometric system also change on a similar time scale, such as polarisation fluctuations in the fibres and these also obscure the magnetic signal.

In conventional all-fibre Mach-Zehnder interferometers the detection of a.c. magnetic signals, where the most sensitive measurements to date have been achieved, is usually accomplished using active homodyne demodulation which maintains the interferometer at quadrature by compensating for low frequency phase variations such as those which arise from temperature. The system maintains maximum interferometric sensitivity to a.c. magnetic fields beyond the frequency range of the compensation. This signal recovery system relies on the amplitude of the magnetic signal being greater than that of the interferometer 1/f noise at the chosen signal frequency. DC magnetic field detection is a more difficult problem because the signal is in the same frequency band as the 1/f noise and one has no prior knowledge of the signal waveform. One conventional interferometer is that disclosed by Koo K. P. et al in "A Fiber Optic DC Magnetometer" IEEE J. Lightwave Technology, LT-1, 3, pp 524-5, 1983. This dc magnetometer uses an all-fibre Mach-Zehnder with a diode laser source and a passive demodulation scheme with a (3×3) coupler. A coil was wound around a metallic glass (magnetostrictive material) sensitised arm, and an a.c. biasing field was applied thereby. A spectrum analyser was used to measure signals at the output of the interferometer which were at the frequency of the alternating bias field. Upon the application of d.c. bias fields, simulating d.c. fields to be detected, the output was shown to be linear up to an applied field of 1 Oe and by comparing the signal due to a known field with the noise of the system the sensitivity was determined to the $10^{-10}$ tesla m$^{-1}$ in a 1 Hz bandwidth. In a magnetic gradient detector both arms of a Mach-Zehnder interferometer are sensitised with magnetostrictive material and they are separated by a desired baseline spacing. Koo K. P. and Sigel G. H. describe a magnetic gradient detector in "A Fibre-Optic magnetic gradiometer" IEEE J. Lightwave Technology, LT-1, 3, p 509, 1983. Both arms of the interferometer were sensitised to the same degree and the device responded to difference in field between the two arms. The optical source and demodulation scheme of the interferometer were the same as described in the first mentioned paper, but there were two sets of excitation coils providing the alternating bias fields, both operating at the same frequency. The magnitudes and phases of the a.c. and d.c. components of these fields were carefully balanced in order to remove any common mode effect caused by variations in the ambient field level. The ability to carry out this fine tuning electrically rather than mechanically altering the coupling between the fibre and the metallic glass is particularly advantageous. The gradient sensitivity that can be achieved is similar to that of the simple total field sensor i.e. $10^{-10}$ tesla m$^{-1}$ with a baseline spacing of 0.1 m.

SUMMARY OF THE INVENTION

According to one aspect of the present invention there is provided an optical fibre magnetic gradient detector which comprises first and second optical fibres arranged as the arms of an optical fibre Mach-Zehnder interferometer and which is adapted to detect two or more magnetic gradients by virtue of the relative arrangement of magnetically sensitised portions of the fibres and the provision of bias fields, for said portions, which oscillate at two or more, respectively, bias frequencies.

According to another aspect of the present invention there is provided a method of detecting two or more magnetic gradients with first and second optical fibres arranged as the arms of an optical fibre Mach-Zehnder interferometer and having magnetically sensitised portions, comprising the steps of providing bias fields at the sensitised portions which oscillate at two or more, respectively, bias frequencies and disposing the sensitised portions relative to one another whereby they can respond to the two or more magnetic gradients to be detected.

BRIEF DESCRIPTION OF THE DRAWINGS

Embodiments of the invention will now be described with reference to the accompanying drawings, in which.

DESCRIPTION OF THE PREFERRED EMBODIMENTS

In order to obtain magnetic field measurements with the quoted sensitivity at low frequencies using an all-fibre Mach-Zehnder interferometer, it is necessary to carry out processing to remove the signal from the 1/f noise. The magnetostriction versus applied field curve is a non-linear, even function of magnetic field (FIG. 1a—solid line), and by application of a suitable alternating bias field (FIG. 1b), the level of the ambient d.c. field may be deduced by examining the response at odd harmonics of the excitation (bias) frequency, in particular the first, or fundamental harmonic. The use of an alternating bias field means that the system is not passive, as electrical connections are needed to produce the bias field which is generated by passing an a.c. current through a coil in which the sensing fibre is disposed, for example. As a result it is not necessary to go to great lengths to achieve a truly passive demodulation scheme for the interferometer which is instead controlled by means of a piezoelectric phase modulator in one arm. This simplifies the support circuitry required and reduces the system noise. The d.c. magnetic signal is measured at a frequency where the amplitude of the 1/f noise is much smaller by an approach using active homodyne demodulation with the piezoelectric phase modulator maintaining quadrature.

Figure 1A:
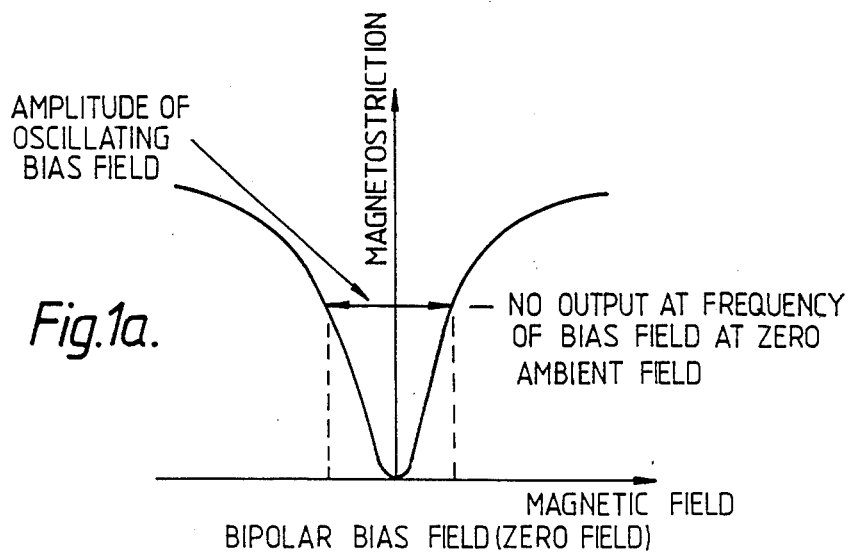
FIGS. 1a, 1b and 1c indicate detection schemes for d.c. fields.
Figure 1B:
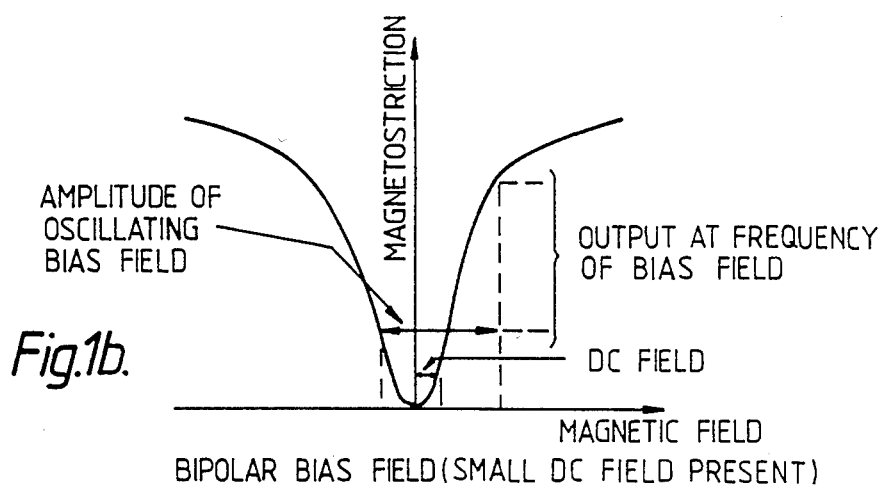
Figure 1C:
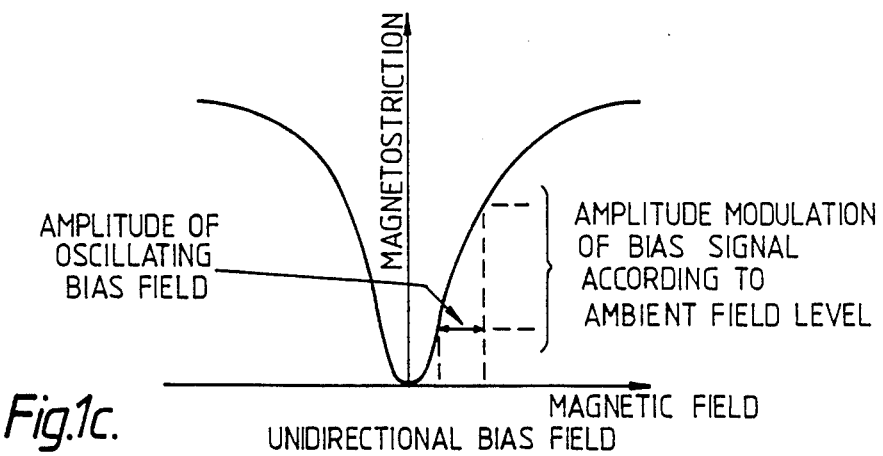

Reference to FIG. 1a shows that for small values of applied field the magnetostriction versus magnetic field curve is parabolic. The application of an oscillatory bias field will, therefore, result in a magnetostrictive response (lambda) given by the product of this bias field and the gradient of the curve lambda = k. H$^2$ d(lambda)/dH = 2k. H This is linear in lambda. Hence the magnetostrictive output at the bias frequency is directly proportional to the ambient field. A further feature of this detection system is that it can provide information about the sign of the d.c. field, whereas a simple magnetostrictive sensor (without a bias), because of the square-law response, can only give an indication of the magnitude of the field. The alternating bias field can be at any frequency which is more than twice that of the highest measurement frequency of interest, a typical value being 1 kHz. This is high enough to extract the signal of interest from the troublesome 1/f noise, while still giving good response from the magnetostrictive material (metallic glasses operate at frequencies up to approximately 10 kHz). Noise sources that are removed by this means include environmental perturbation of the optical path length along the fibres and, to first order, fluctuations in the state of polarisation of light transmitted along the fibre. FIG. 1(b) illustrates the operation of the detection scheme of FIG. 1a when a small d.c. field is present. FIG. 1c illustrates the operation of an alternative d.c. field detection scheme, this time employing a unidirectional oscillating bias field rather than the bipolar bias fields of FIGS. 1a and b.

A magnetic gradient detector consisting of an optical detector module and a separate control electronics module may have advantages by way of facilitating their relative disposal in use, however if so required the detector and control electronics may be integral. A sensor head (optical detector) 1 is shown schematically in FIG. 2 and is based on an all-fibre Mach-Zehnder interferometer with both arms magnetically sensitive. Coils (planar and horizontal) of sensitised optical fibre, such as coil 2, are located inside solenoids 3, 4 and 5 which provide the necessary oscillating bias fields for the d.c. detection technique. There is an optical fibre coil 2 in solenoid 5, an optical fibre coil 6 (not shown in FIG. 2) in solenoid 3, which has two separate windings, and an optical fibre coil 7 (not shown in FIG. 2) in solenoid 4. The design of the optical system is shown in FIG. 3. One arm of the interferometer, which can be considered a reference arm, includes only one coil of sensitised optical fibre, that is coil 6 which is disposed in solenoid 3. The coils of sensitised fibre 2 and 7 are connected in series in the other signal arm of the interferometer. The output of a stabilised laser 8 is applied to both arms of the interferometer via a 3 dB input coupler 9. The output optical signals are applied to a detector means 11 via a 3 dB output coupler 10. The component of magnetic field to be measured is that directed along the axis of the solenoids 3 and 4. Coils 6 and 7 thus give the gradient of the field along its own axis and coils 6 and 2 give the gradient of the field along an axis perpendicular to that of the field component. The resultant optical signal are multiplexed onto the same interferometer by taking advantage of the d.c. detection technique whereby a signal of interest is modulated onto a carrier. This enables one sensor head to measure two gradients simultaneously. Operation of the detector will be described further hereinafter with reference to FIGS. 5, 6 and 7.

Figure 4:
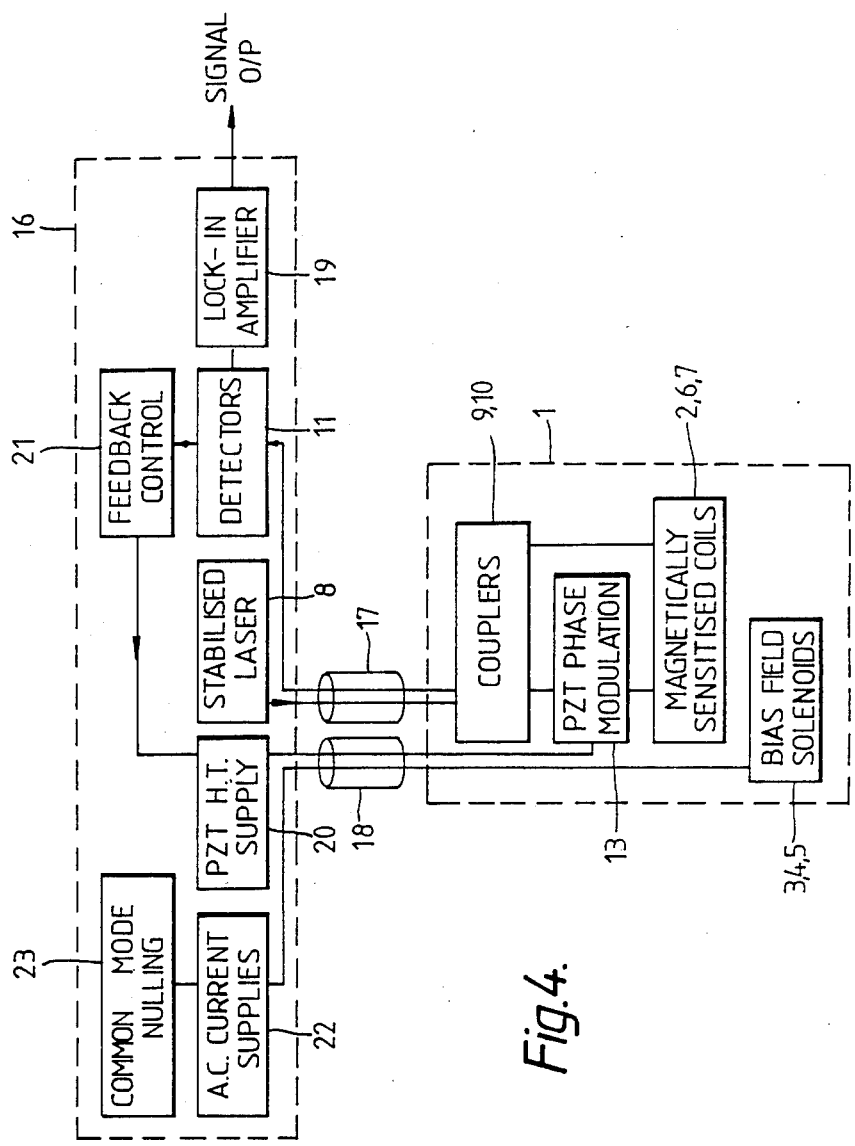
FIG. 4 illustrates a systems diagram of the detector of FIGS. 2 and 3.

To obtain maximum benefit from the detection scheme, digitally generated sinewave current sources with minimal harmonic content are employed as the sources for the bias field solenoids. Thus the crosstalk between the two channels is minimised and the accuracy of the first harmonic signal is maximised, it being the first harmonic component of the photodetector output which is increased in proportion to the magnitude of the gradient of the magnetic field. The arm including sensitised coil 6 also includes an unsensitised coil 12, which coil 12 is disposed around a PZT cylinder 13 constituting the above mentioned piezoelectric phase modulator. FIG. 4 shows a block diagram of the complete system. Block 1 comprises the sensor head (optical detector module) whereas block 16 comprises a control electronics module. The blocks are interconnected by an optical cable 17 and an electrical cable 18. The block 1 includes the elements of FIG. 2 namely the couplers 9 and 10, the PZT phase modulator 13 with its fibre coil 12, the magnetically sensitised coils 2, 6 and 7 and the bias field solenoids 3, 4 and 5. The block 16 includes the stabilised laser 8, the detector means 11, a lock-in amplifier 19 coupled to the detector means output, a PZT H.T. supply 20, which is controlled by the detector means 11 via a feedback control 21, and a.c. current supplies 22, for the bias field solenoids, with a common mode nulling means 23. With d.c. magnetic field signals in the frequency range 0.03 to 1 Hz, for example, maximum sensitivity is achieved for that range due to the large integration time available for the signal by the lock-in amplifier 19. For the detection of higher frequency signals spectrum analysis may be preferable, however the signal to noise ratio available for this mode of data recovery is inferior to that from a lock-in amplifier system.

The all-fibre Mach-Zehnder interferometer is constructed from single mode fibre and fused all-fibre 3 dB couplers are preferable. Fibre tails from the various components are preferably fusion spliced together so that no micropositioners or bulk optical components are required and resulting in an extremely rugged system. The laser light source 8 may be a single frequency laser diode operating at 0.85 micrometers or 1.3 micrometers wavelength, the detector means being chosen accordingly. Semiconductor diode lasers have the advantage of small size, modest power supply requirements and ruggedness, but for interferometry they are inferior to gas lasers in their coherence length and output wavelength stability. It is, however, possible to stabilise the output wavelength using an all-fibre Fabry-Perot cavity to lock it, attention is directed in this respect to our co-pending G.B. application No. 8401143 (published U.K. application No. 2154787A) (R. E. Jones-R. H. Pratt 5-1). The stabilised laser 8 also includes means for controlling the temperature of its mount, such as by means of a Peltier cooler and thermistor module.

Figure 2:
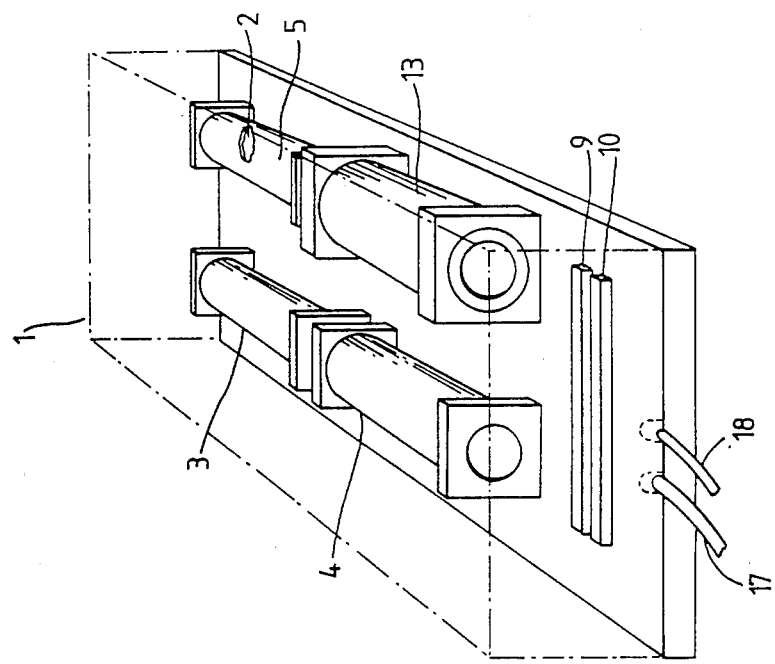
FIG. 2 illustrates, schematically, the sensor head of a fibre optic magnetic gradient detector arranged to detect two magnetic gradients at right angles to one another.
Figure 3:
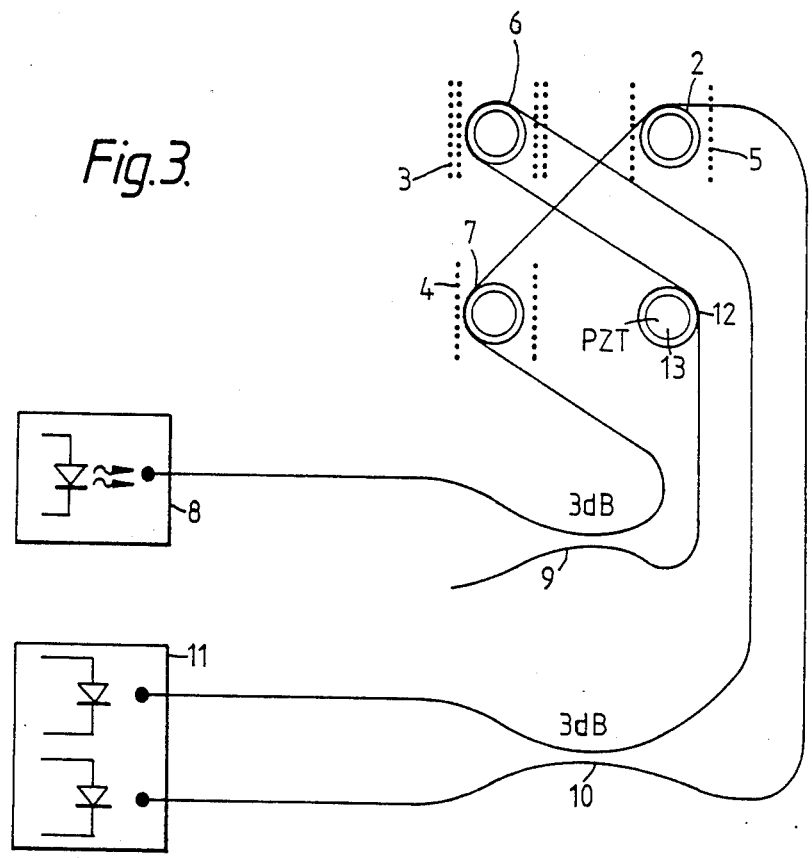
FIG. 3 illustrates, schematically, the optical system of the detector of FIG. 2.

Instead of employing the sensor head of FIG. 2, that is optical detector module of block 1 of FIG. 4 with the control electronics block 16 including the lock-in amplifier 19 or a spectrum analyser to provide a measure of magnetic field gradient, a known field gradient may be applied, for example by means of Helmholtz coils, so that the gradient to be measured is cancelled, the current in the coils then providing a measure of the gradient.

The operation of the two gradient detector of FIGS. 2 to 4 will now be discussed in greater detail with reference first to FIG. 5 which shows, schematically, a known single optical fibre magnetometer interferometer comprising an optical fibre 30 a portion of which is magnetically sensitised by a magnetostrictive element 31, an optical fibre 32 comprising a reference fibre with a PZT phase modulator 33 associated therewith, the fibres being coupled by 3 dB couplers 34 and 35. The magnetostrictive element 31 is disposed within a coil 36 coupled to a supply source 37 which supplies an a.c. bias field at frequency w. The output of a laser 38 is applied to one optical fibre and to the interferometer comprised by the two optical fibre arms 30 and 32. The interferometer outputs are detected by detectors 39 and 40, whose outputs as well as indicating the magnetic fields are employed to control the phase modulator 33 via operational amplifier 41 and integrator 42.

It the magnetostrictive element 31 is subjected both to the field of interest (the d.c. field to be measured) and the a.c. bias field at frequency w, then the non-linear characteristics of the magnetostrictive material will cause mixing of the two signals. Hence the signal at the detector will have a component at frequency w which is proportional to the d.c. field of interest.

Figure 5:
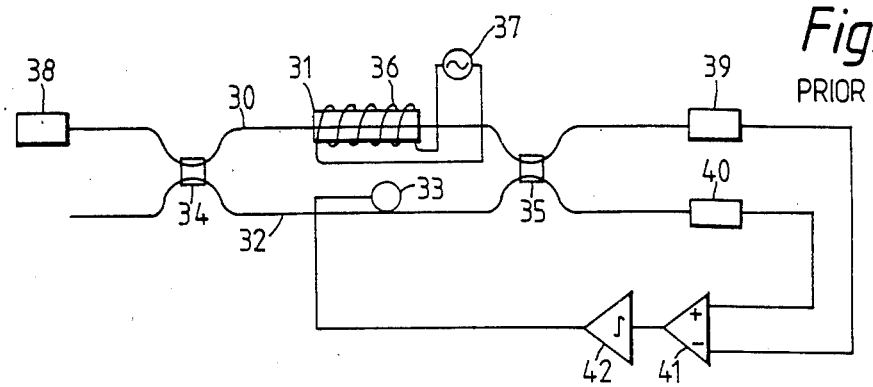
FIG. 5 illustrates an optical fibre magnetometer.
Figure 6:
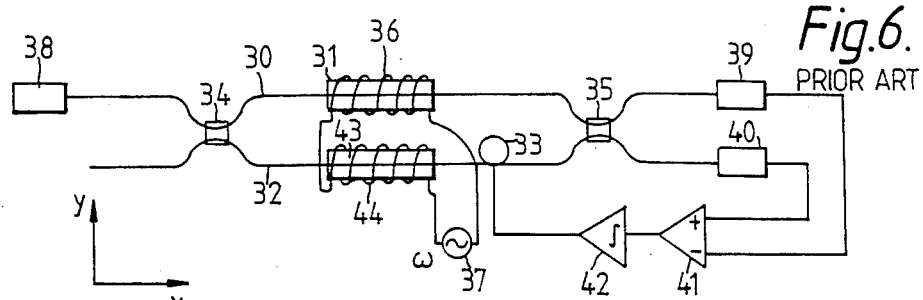
FIG. 6 illustrates one configuration of an optical fibre magnetic gradient detector.

A magnetic gradient can be measured by placing two of the known interferometers of FIG. 5 side by side, with the appropriate baseline spacing, but it is much more elegant to incorporate a magnetostrictive element and bias coil into the other arm of the same interferometer. One possible configuration is shown in FIG. 6 which uses the same reference numerals to those in FIG. 5 for similar elements. A further magnetostrictive element 43 and bias coil 44 are included. The bias coils 36 and 44 are connected in series and driven by the same supply source 37 at frequency w. In this configuration the sensors are measuring the magnetic field along the x direction, $B_x$. The magnetostrictive elements are spaced apart along the y axis and hence the gradient measured is $dB_x/dy$.

Figure 7:
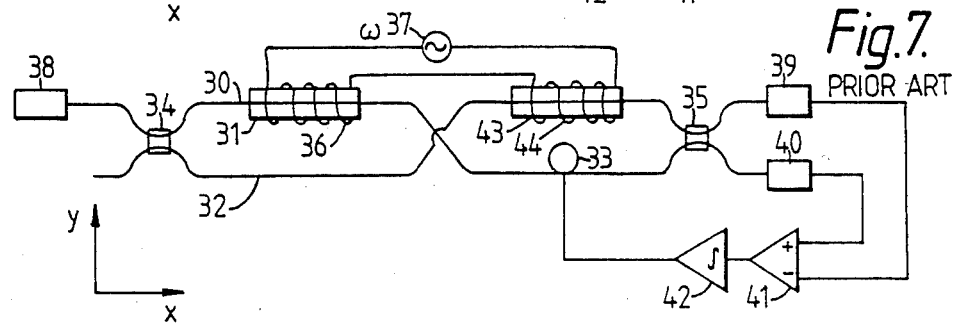
FIG. 7 illustrates an alternative configuration of optical fibre magnetic gradient detector.

In an alternative configuration shown in FIG. 7, which uses the same reference numerals to those in FIG. 6 for similar elements, the sensors are measuring the magnetic field along the x direction, $B_x$. The elements are also separated along the x axis, so the gradient measured is $dB_x/dx$.

Figure 8:
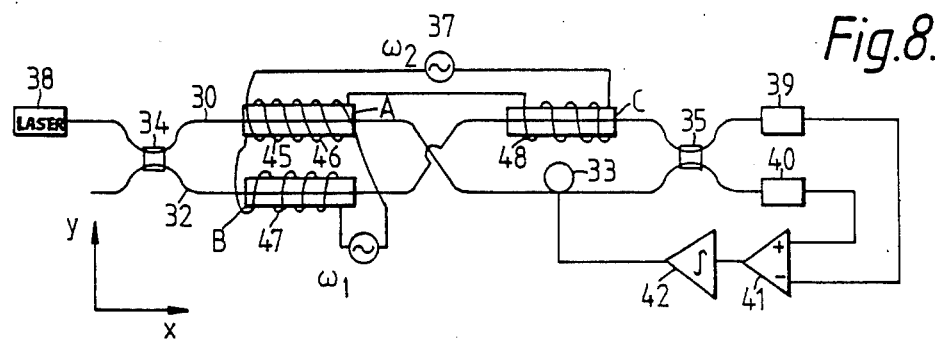
FIG. 8 illustrates the detector of FIG. 2 when drawn in the same format as FIGS. 5 to 7.

To measure these two gradients $dB_x/dy$ and $dB_x/dx$ simultaneously, one could use two interferometers placed close together, however the arrangement of FIG. 2 permits the carrying out of both measurements using one interferometer. FIG. 8 is equivalent to FIG. 2 but drawn in the same manner as FIGS. 5 and 7 the coils of optical fibre being indicated by lengths of optical fibre and associated magnetostrictive elements. The magnetostrictive element A, associated with fibre coil 6, is surrounded by two bias coils 45 and 46. Coil 45 is in series with coil 47 wound around magnetostrictive element B, associated with fibre coil 7, and these carry a current at frequency $w_1$. The coil 46 is in series with coil 48 wound around magnetostrictive element C, associated with fibre coil 2, and these carry a current at frequency $w_2$. This means that the signals at the detectors at frequency $w_1$, will relate to elements A and B (fibre coils 6 and 7) and thus to $dB_x/dy$ and the signals at the detectors at frequency $w_2$ will relate to elements A and C (fibre coils 2 and 6) and thus to $dB_x/dx$. Thus the two required magnetic field gradient outputs are obtained from the same interferometer.

In the case of sensitised optical fibre coils, formed by coiling up optical fibre coated with magnetostrictive material, the coating is preferably less than 100 microns thick. The thinner the coating the more turns there can be in the coil. The coating should be as thin as possible to minimise the effect of the demagnetising field inherent with the coil structure, but thick enough to minimise the effect of mass loading on the magnetostrictive strain.

We claim:

1. An optical fibre magnetic gradient detector for detecting two orthogonal magnetic gradients, which detector comprises:
    first and second optical fibres arranged in the arms of an optical fibre Mach-Zehnder interferometer;
    a first portion of the first optical fibre and first and second portions of the second optical fibre being magnetically sensitised by association therewith of respective magnetostrictive material such that application of a d.c. magnetic field to said magnetostrictive material causes a corresponding change in optical path length within the respective fibre portion;

wherein the first portion of the first optical fibre is spaced apart from the first portion of the second optical fibre in a first direction;

wherein the first portion of the first optical fibre is spaced apart from the second portion of the second optical fibre in a second direction, which first and second directions are orthogonal;

the first and second portions of the second optical fibre each being disposed within respective solenoid means to which respective a.c. signals are applied such that respective bias fields oscillating at first and second differing frequencies are provided thereat;

the first portion of the first optical fibre being provided with solenoid means so as to provide thereat two bias fields, one oscillating at said first frequency and the other oscillating at said second frequency, the bias fields of the first portion of said first optical fibre and the second portion of said second optical fibre being aligned with the second direction, and the bias fields of the first portion of said first optical fibre and the first portion of said second optical fibre being parallel; and wherein in use each said fibre portion has an output including a component at the or each respective a.c. frequency which is proportional to the d.c. magnetic field threreat and from which the magnitude of the two orthogonal magnetic gradients can be determined, the first portions of the first and second optical fibres responding to one of said two orthogonal magnetic gradients and the first portion of the first optical fibre and the second portion of the second optical fibre responding to the other of said two orthogonal magnetic gradients.

2. An optical fibre magnetic gradient detector as claimed in claim 1, including means for coupling a light source to input ends of the first and second fibres and means for detecting light from output ends thereof, detected signals at the first frequency being related to the magnetic gradient in the first direction and detected signals at the second frequency being related to the magnetic gradient in the second direction.

3. An optical fibre magnetic gradient detector as claimed in claim 1 wherein the a.c. signals comprise digitally generated sine waves.

4. An optical fibre magnetic gradient detector as claimed in claim 1 wherein the magnetically sensitised fibre portions comprise planar sensing coils disposed in the plane including the first and second directions.

5. An optical fibre magnetic gradient detector as claimed in claim 4, wherein the fibre of the coils is magnetically sensitised by the application of a magnetostrictive coating material thereto, the thickness of the coating being as thin as possible to minimise the effect of the demagnetising field and thick enough to maximise the effect of mass loading on the magnetostrictive strain.

6. An optical fibre magnetic gradient detector as claimed in claim 2 and including a piezoelectric phase modulator associated with the first fibre and controlled by the detector means output and serving to control the interferometer.

7. An optical fibre magnetic gradient detector as claimed in claim 1 and including means to apply known field gradient whereby to cancel each magnetic gradient to be detected and thus provide a measure of the gradient to be detected.

8. A method of detecting two orthogonal magnetic gradients with first and second optical fibres arranged as the arms of an optical fibre Mach-Zehnder interferometer, a first portion of the first optical fibre and first and second portions of the second optical fibre being magnetically sensitised by association therewith of a respective magnetostrictive material such that application of a d.c. magnetic field to said magnetostrictive material causes a corresponding change in optical path length within the respective fibre portion, including the steps of:

spacing the first portion of the first optical fibre apart from the first portion of the second optical fibre in a first direction and spacing the first portion of the first optical fibre apart from the second portion of the second optical fibre in a second direction, which first and second directions are orthogonal;

disposing each of the first and second portions of the second optical fibre in respective solenoids;

applying respective a.c. signals to the solenoids so as to provide at the first portion of said second optical fibre a bias field oscillating at a first frequency and to provide at the second portion of said second optical fibre a bias field oscillating at a second frequency;

disposing the first portion of the first optical fibre in a respective solenoid means;

applying a.c. signals to said solenoid means so as to provide at the first portion of the first optical fibre two bias fields, one osillating at the first frequency and one oscillating at said second frequency, the bias fields of said first portion of the first optical fibre and the second portion of the second being aligned with the second direction and the bias fields of the first portion of the first optical fibre and the first portion of the second optical fibre being parallel, the output of each fibre portion including a component at the or each respective a.c. frequency which is proportional to the d.c. magnetic field thereat and from which the magnitude of the two orthogonal magnetic gradients can be determined, the first portions of the first and second optical fibres responding to one of said two orthogonal magnetic gradients and the first portion of the first optical fibre and the second portion of the second optical fibre responding to the other of said two orthogonal magnetic gradients.

9. A method as claimed in claim 8, including the steps of applying light to input ends of the first and second fibres, and detecting light from output ends thereof, detected signals at the first frequency being related to the magnetic gradient in the first direction and detected signals at the second frequency being related to the magnetic gradient in the second direction.

10. A method as claimed in claim 8, including the step of applying a known field gradient whereby to cancel each magnetic gradient to be detected and thus provide a measure of the gradient to be detected.

11. An optical fibre magnetic gradient detector for detecting two orthogonal magnetic gradients, which detector comprises:

first and second optical fibres arranged in the arms of an optical fibre Mach-Zehnder interferometer;

a first portion of the first optical fibre and first and second portions of the second optical fibre being magnetically sensitised by association therewith of respective magnetostrictive material such that application of a d.c. magnetic field to said magnetostrictive material causes a corresponding change in optical path length within the respective fibre portion;

wherein the first portion of the first optical fibre is spaced apart from the first portion of the second optical fibre in a first direction;

wherein the first portion of the first optical fibre is spaced apart from the second portion of the second optical fibre in a second direction, which first and second directions are orthogonal;

the first and second portions of the second optical fibre each being disposed within respective solenoid means to which respective a.c. signals are applied such that respective bias fields oscillating at first and second differing frequencies are provided thereat;

the first portion of the first optical fibre being provided with solenoid means so as to provide thereat two bias fields, one oscillating at said first frequency and the other oscillating at said second frequency, the bias fields of the first portion of said first optical fibre and the second portion of said second optical fibre being aligned with the second direction, and the bias fields of the first portion of said first optical fibre and the first portion of said second optical fibre being parallel; and wherein in use each said fibre portion has an output including a component at the or each respective a.c. frequency which is proportional to the d.c. magnetic field thereat and from which the magnitude of the two orthogonal magnetic gradients can be determined, the first portions of the first and second optical fibres responding to one of said two orthogonal magnetic gradients and the first portion of the first optical fibre and the second portion of the second optical fibre responding to the other of said two orthogonal magnetic gradients, and including means for coupling a light source to input ends of the first and second optical fibres and means for detecting light from output ends thereof, detected signals at the first frequency being related to the magnetic gradient in the second direction, and wherein the a.c. signals comprise digitally generated sine waves.

* * * * *